(12) United States Patent
Ou et al.

(10) Patent No.: US 6,644,533 B2
(45) Date of Patent: Nov. 11, 2003

(54) FORCE SENSING APPARATUS

(75) Inventors: Gang Ou, Singapore (SG); Gary Peter Widdowson, Hong Kong (HK); Ka Shing Kenny Kwan, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 10/118,488

(22) Filed: Apr. 5, 2002

(65) Prior Publication Data

US 2002/0109001 A1 Aug. 15, 2002

Related U.S. Application Data

(62) Division of application No. 09/869,734, filed as application No. PCT/SG99/00118 on Nov. 10, 1999, now Pat. No. 6,425,514.

(51) Int. Cl.[7] .................................................. B23K 1/06
(52) U.S. Cl. ..................................... 228/102; 228/110.1
(58) Field of Search ...................... 228/102, 1.1, 110.1, 228/180.5, 4.5; 156/73.1, 73.2, 580.1, 580.2; 310/311

(56) References Cited

U.S. PATENT DOCUMENTS

| | | | |
|---|---|---|---|
| 4,854,494 A | 8/1989 | von Raben | 228/102 |
| 4,903,883 A | 2/1990 | Thurlemann | 228/1.1 |
| 4,984,730 A | 1/1991 | Gobel | 228/1.1 |
| 5,230,458 A | 7/1993 | Asanasavest | 228/102 |
| 5,314,105 A | * 5/1994 | Farassat | 228/102 |
| 5,607,096 A | 3/1997 | Asanasavest | 228/1.1 |
| 6,152,350 A | * 11/2000 | Hayashi et al. | 228/102 |
| 6,279,810 B1 | * 8/2001 | Chan-Wong et al. | 228/1.1 |

FOREIGN PATENT DOCUMENTS

EP   0540189   5/1993

* cited by examiner

*Primary Examiner*—Tom Dunn
*Assistant Examiner*—Jonathan Johnson
(74) *Attorney, Agent, or Firm*—Ostrolenk, Faber, Gerb & Soffen, LLP

(57) ABSTRACT

Force sensing apparatus is provided for sensing deflection of a transducer in an ultrasonic welding machine. The apparatus includes a body member, a transducer holder and a force sensor. The transducer holder is adapted to hold an ultrasonic transducer and the transducer holder is fixed to the body member. The force sensor is located between adjacent surfaces of the body member and the transducer holder to sense a force applied between the surfaces.

6 Claims, 1 Drawing Sheet

FORCE SENSING APPARATUS

CROSS REFERENCE TO RELATED APPLICATION

The present application is a division under 37 C.F.R. §1.53(b) of prior application Ser. No. 09/869,734, filed Jul. 3, 2001 now U.S. Pat. No. 6,425,514, which was the national stage of application number. PCT/SG99/00118, filed Nov. 10, 1999.

The invention relates to force sensing apparatus and in particular, force sensing apparatus for monitoring the bond force in an ultrasonic welding machine.

Ultrasonic welding is commonly used for wire bonding when packaging semiconductor devices and for other bonding operations. Force sensors are used in the ultrasonic wire bonding machines to either monitor the quality of the wire bond by measuring the bond force or to generate the required bond force in response to signals from the sensor.

In some arrangements the force sensor is located in a structure which is external from and isolated from the transducer. In other designs, the force sensor is mounted on the transducer body itself.

Sensors residing on the body of the ultrasonic transducer are normally of the balanced strain gauge design. They measure the surface strains produced by bending of the transducer during bonding and thus indirectly obtain information regarding the bond force. However, as they contact the transducer body they exert a load on the transducer, which interferes with the operation of the transducer.

Force sensors located in force arms external to the bondhead are, in general, not compact.

In general, piezoelectric force sensors and electrorestrictive force sensors suffer from the problem of output voltage drift. This introduces errors in successive measurements. To overcome this problem, a number of the prior art machines (see for example, U.S. Pat. Nos. 4,903,883 and 5,607,096) use two or more sensors to mutually compensate for any drift.

However, this has the disadvantage of increasing the cost and size of the sensor arrangement and also increases the processing required for the sensor signals.

In accordance with a first aspect of the present invention, there is provided force sensing apparatus for sensing deflection of a transducer in an ultrasonic welding machine, the apparatus comprising a body member, a transducer holder adapted to hold an ultrasonic transducer, the transducer holder being fixed to the body member, and a force sensor located between adjacent surfaces of the body member and the transducer holder to sense a force applied between the surfaces.

Preferably, the force sensor senses a force applied in a direction substantially parallel to the longitudinal axis of the transducer.

Typically, the adjacent surfaces of the body member and the transducer holder are oblique to the longitudinal axis of the transducer. Preferably, the adjacent surfaces are substantially perpendicular to the longitudinal axis of the transducer.

Preferably, the force sensor comprises a piezoelectric force sensor. Alternatively, the force sensor may comprise an electrostrictive force sensor.

Preferably, the sensing apparatus comprises a biasing device located between one of the adjacent surfaces and the force sensor to provide a preload to the force sensor.

In accordance with a second aspect of the present invention, there is provided a method of compensating a force sensor for performance changes in the sensor, the method comprising:

(a) at the beginning of a first time interval taking a first reference reading from the sensor with a reference force applied to the sensor;

(b) using the first reference reading as a reference for readings from the sensor during the first time interval to obtain an indication of an unknown force applied to the sensor; and after the end of the first time interval repeating steps (a) and (b).

An advantage of this aspect of the invention is that it permits force sensors which are prone to drift by resetting the reference level for the sensor at periodic time intervals.

Preferably, the force sensor may be a piezoelectric force sensor or a electrorestrictive force sensor.

Typically, the reference reading is a reading of the voltage output from the sensor.

Typically, steps (a) and (b) are repeated as frequently as necessary to obtain a sufficiently accurate indication of the unknown force for the application in which the force sensor is being used. The length of subsequent time intervals may be the same as or different from the first time interval.

Typically, the force sensor may be a force sensor for monitoring the contact force of an ultrasonic welding transducer on a workpiece. For example, the transducer may be a wire bonding transducer and the workpiece may be a contact pad of a semiconductor die or lead frame to which a wire is to be bonded by the transducer.

Preferably, where the force sensor monitors the contact force of an ultrasonic weld transducer, the first time interval corresponds to the time interval between separate welds, or between a number of welds.

Examples of force sensing apparatus in accordance with the invention will now be described with reference to the accompanying drawings, in which.

Figure 1:
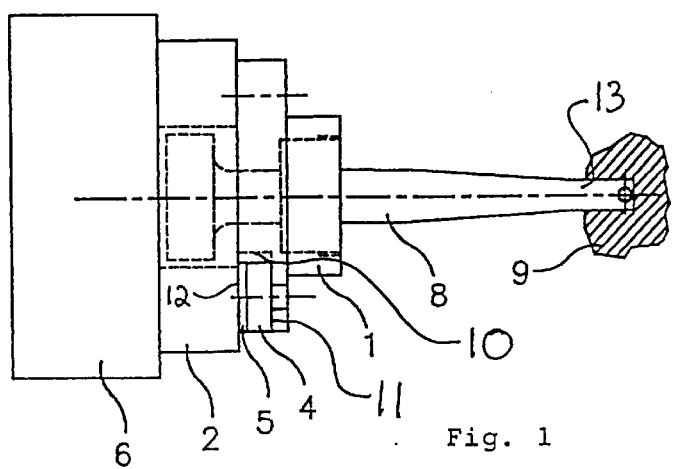
FIG. 1 is plan view of a bond body for a wire bonding machine with a first example of a transducer holder and a transducer.
Figure 2:
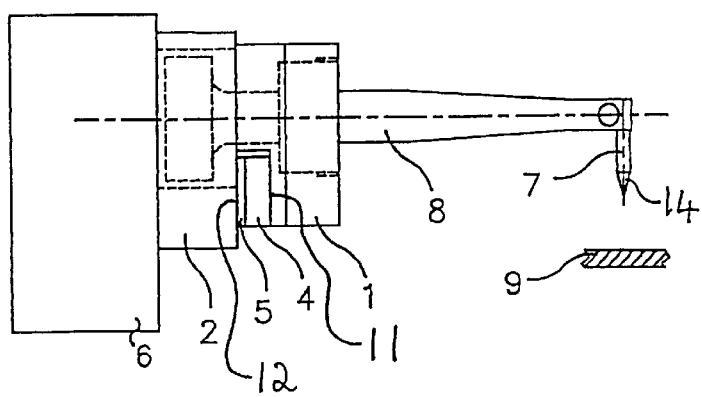
FIG. 2 is a side view of the bond body and the first transducer holder.
Figure 3:
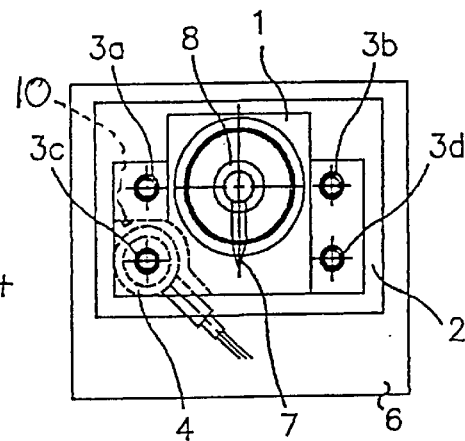
FIG. 3 is an end view of the bond body and the first transducer holder.

FIGS. 1, 2 and 3 show a first example of a transducer holder 1 which is mounted on a bond-body 2 using four screws 3a, 3b, 3c and 3d. The holder 1 has a recessed portion 10 in which a piezoelectric sensor 4 and a spring washer 5 are located. The sensor 4 is disc shaped with a central hole through which the screw 3c extends. The sensor 4 is sandwiched between a face 11 of the recessed portion 10 of the transducer holder 1 and the spring washer 5. The spring washer 5 is sandwiched between a surface 12 of the bond-body 2 and the sensor 4. Although the force sensor 4 is a piezoelectric force sensor, the force sensor 4 could be an electrorestrictive force sensor.

The two planar faces of the force sensor 4, are precision ground to a high degree of flatness and parallelism. The spring washer 5 provides a pre-load to the force sensor 4. The pre-load can be adjusted by adjusting the torque applied to the screws 3a, 3b, 3c and 3d, which can be set using a conventional torque driver (not shown).

A transducer 8 is mounted in the holder 1 such that a working end 13 of the transducer 8 extends away from the holder 1 and the bond body 2. The transducer 8 is a conventional transducer used for ultrasonic welding to bond wires to contact pads of semiconductor dies and lead frames during the packaging of semiconductor devices. The working end 13 includes a capillary 7, which has a through bore extending along its longitudinal axis. The through bore permits a wire (not shown) to be bonded to a workpiece 9 to pass through the capillary 7 to a tip 14 of the capillary 7. Hence, when the transducer vibrates at an ultrasonic frequency, and the tip 14 is in contact with the workpiece 9, the end of the wire vibrates against the workpiece 9 to ultrasonically weld the wire to the workpiece 9.

The bond body 2 is mounted on an actuator 6 which moves the bond body 2 by translation or limited angular rotation, until the tip 14 of the capillary 7 contacts the workpiece 9 to which the wire is to be bonded. After contact is made, the actuator 6 increases the applied force on the bond body 2, which generates a proportional increase in the reaction force of the workpiece 9 on the capillary tip 14. This force generates a bending moment on the transducer holder 1, which results in a partial loss of the pre-load on the force sensor 4. As the force sensor 4 is a piezoelectric force sensor, the sensor 4 generates a voltage which is indicative of the force applied between the surfaces to the sensor 4. Therefore, a change in the pre-load applied to the sensor produces a change in the voltage from the sensor 4, which is proportional to the change in pre-load. Therefore, the voltage signal emitted by the sensor can be processed to provide an indication of the contact force (or bond force) between the tip 14 and the workpiece 9.

Figure 4:
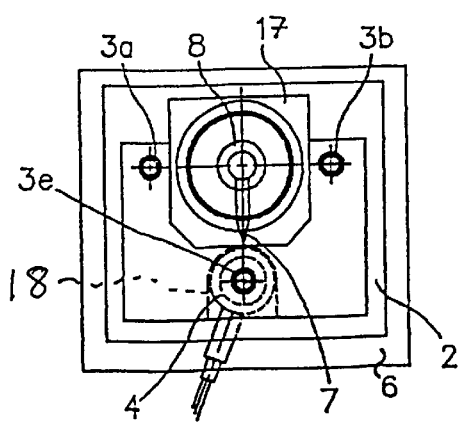
FIG. 4 is an end view of the bond body with a second example of a transducer holder.

A second example of a transducer holder 17 is shown in FIG. 4. The transducer holder 17 is mounted onto the bond body 2 by three screws 3a, 3b, 3e. Two of the screws 3a, 3b are located adjacent an upper edge of the holder 17 and the third screw 3e is located centrally adjacent a lower edge of the holder 17. The force sensor 4 is located in a central recess 18 at the lower edge of the holder 17 and the screw 3e extends through the recess 18, the force sensor 4 and the spring washer 5 (not shown in FIG. 4).

Figure 5:
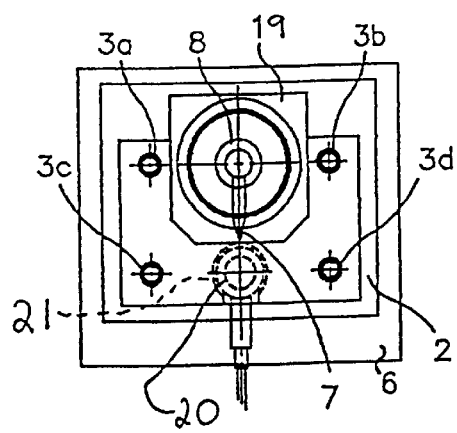
FIG. 5 is an end view of the bond body with a third example of a transducer holder.

A third example of a transducer holder 19 is shown in FIG. 5. The holder 19 is more compact than the holders 1, 17 as there is no central hole in the force sensor 20. The pre-load is provided by the screws 3a, 3b, 3c, 3d at the corners of the holder 19 which are spaced from the sensor 20. The sensor 20 and spring washer 5 (not shown in FIG. 5) are located in a recess 21 located centrally adjacent the lower edge of the transducer holder 19.

The transducer holders 17, 19 and the sensors 4, 20 in FIGS. 4 and 5 operate in the same manner as the transducer holder 1 and sensor 4 in FIGS. 1 to 3. In general, the force sensor 4, 20 can be located at any convenient location, sandwiched between the transducer holder 1, 17, 19 and the bond body 2.

By having an indication of the bond force it is possible to determine the quality of a bond as the bond force has an effect on bond quality. In addition, the voltage signal as a measure of the bond force, can be used as an input to a closed loop control system for the bond head to enable higher operational speeds and better process control.

During motion from one bond to the next bond, the acceleration of the bond head also generates vibration of the transducer 8 which also gives rise to bending moments on the transducer holder 1, 17, 19. These bending moments either tend to unload or further load the force sensor 4, 20 depending upon the direction of acceleration. The resulting changes in the voltage signal from the sensor 4, 20 is thus a measure of the inertial forces on the bond body 2, transducer holder 1, 17, 19 and transducer 8 during motion. This voltage signal also forms an important input to the control system of the bond head.

The present invention uses only one sensor 4, 20 and mitigates the problem of voltage drift by resetting the force sensor 4, 20 after every bond and re-activating it again just before the next bond. The voltage level from the sensor at re-activation is used as the reference level. The voltage level during bonding is then subtracted from the reference level. This difference in the voltage levels just before and during bonding is the measure of the bond force. This method of compensating for voltage drift assumes that the rate of drift is negligible during one bonding operation so that the amount of accumulated drift during the active period (a single bonding operation) of the force sensor 4, 20 is negligible.

Therefore, the invention has the advantages of using a single force sensor 4, 20 by compensating for output voltage drift of the sensor. This enables the sensor arrangement to be compact and less expensive and less complicated than prior art arrangements.

What is claimed is:

1. A method of compensating a force sensor for performance variations in the sensor, the method comprising:
   (a) at the beginning of a time interval taking a first reference reading from the sensor with a reference force applied to the sensor;
   (b) using the first reference reading as a reference for readings from the sensor during the time the interval to obtain an indication of an unknown force applied to the sensor; and
   after the end of the time interval repeating steps (a) and (b) for another time interval.

2. A method according to claim 1, wherein the force sensor to be compensated is a piezoelectric force sensor.

3. A method according to claim 1, wherein the force sensor to be compensated is an electrorestrictive force sensor.

4. A method according to claim 1, wherein the reference reading is a reading of the voltage output from the sensor.

5. A method according to claim 1, wherein the length of the time interval is different from the length of the other time interval; and wherein the force sensor is a force sensor for monitoring the contact force of an ultrasonic welding transducer on a workpiece.

6. A method according to claim 1, wherein the time interval is the time interval between welds.

* * * * *